United States Patent
Crofoot et al.

(10) Patent No.: US 7,291,031 B2
(45) Date of Patent: Nov. 6, 2007

(54) ZERO INSERTION FORCE CABLE INTERFACE

(75) Inventors: Larry M. Crofoot, Perry, OH (US); Alan L. Roath, Madison, OH (US); John T. Venaleck, Painesville, OH (US)

(73) Assignee: Ohio Associated Enterprises, LLC, Painesville, OH (US)

( * ) Notice: Subject to any disclaimer, the term of this patent is extended or adjusted under 35 U.S.C. 154(b) by 0 days.

(21) Appl. No.: 11/177,658

(22) Filed: Jul. 8, 2005

(65) Prior Publication Data

US 2006/0014417 A1    Jan. 19, 2006

Related U.S. Application Data

(60) Provisional application No. 60/587,447, filed on Jul. 13, 2004.

(51) Int. Cl.
*H01R 13/15* (2006.01)
*H01R 13/62* (2006.01)

(52) U.S. Cl. ...................... 439/265; 439/259
(58) Field of Classification Search ............... 439/267, 439/260–262, 342, 265, 492, 277, 157, 269.2, 439/259
See application file for complete search history.

(56) References Cited

U.S. PATENT DOCUMENTS

| | | | | |
|---|---|---|---|---|
| 3,818,419 A * | 6/1974 | Crane | ...................... | 439/267 |
| 3,828,301 A * | 8/1974 | Neidecker | .................... | 439/265 |
| 4,077,688 A * | 3/1978 | Cobaugh et al. | ............ | 439/267 |
| 4,178,053 A * | 12/1979 | Eifort | .......................... | 439/267 |
| 4,392,705 A * | 7/1983 | Andrews et al. | ............ | 439/342 |
| 5,795,171 A * | 8/1998 | Bernardini | .................. | 439/260 |
| 5,795,172 A * | 8/1998 | Shahriari et al. | ........... | 439/260 |
| 5,808,474 A * | 9/1998 | Hively et al. | ................ | 324/755 |
| 6,356,449 B1 * | 3/2002 | Sasaki et al. | ................ | 361/749 |
| 6,679,714 B2 * | 1/2004 | Kimura | ...................... | 439/261 |
| 6,824,410 B1 * | 11/2004 | Co et al. | ..................... | 439/260 |
| 6,979,216 B2 * | 12/2005 | Maeda et al. | ................ | 439/260 |
| 2002/0028588 A1 * | 3/2002 | Watanabe et al. | ............. | 439/62 |

* cited by examiner

*Primary Examiner*—Hae Moon Hyeon
(74) *Attorney, Agent, or Firm*—Renner, Otto, Boisselle & Sklar, LLP (57) ABSTRACT

A connector assembly includes a female dual row connector, and a male dual row connector configured to be inserted into the female dual row connector. The female connector is configured to be compression mounted onto a circuit card, and has conductive tails for being brought into contact with traces on the card or circuit board. The female connector may have a stiffener to help it maintain its shape. The rows of contacts of the male connector may be selectively brought together (collapsed) or moved apart (expanded). The rows of contacts are collapsed during insertion or removal of the male connector from the female connector, thus allowing zero force insertion of the male connector into the female connector. The collapsing and expanding of the rows for the male connector may be accomplished through any of a variety of mechanisms.

22 Claims, 9 Drawing Sheets

ZERO INSERTION FORCE CABLE INTERFACE

This application claims the benefit of U.S. Provisional Application No. 60/587,447, filed Jul. 13, 2004, which is hereby incorporated by reference in its entirety.

BACKGROUND OF THE INVENTION

1. Technical Field of the Invention

This invention relates to electrical connectors, and to methods for coupling together and de-coupling electrical connectors.

2. Description of the Related Art

In the field of silicon chip testing, probe cards with multiple probes attached have been used to contact specific, accurately-located probe points on the chip. Multiple transmission line cables have been used to communicate the probe-board positions with an attendant test computer. Typically, the interface between the test computer and the probe card has been a multiplicity of spring pins (commonly referred to as "pogo pins") positioned to engage the probe board in compression, and coupled to the transmission lines to the cable. However, for some testing applications many pins, i.e., 1,000 pins or more, are required, making the forces normal to the probe board substantial. Deflection of the probe board caused by the total compressive force of the pogo pins will cause the probe pins to move and possibly lose their accurate positioning.

Many methods have been employed in the past to ameliorate this loss of accurate positioning of the probe pins. Examples of such methods are putting reinforcing strips on the board surface, using a vacuum support of the probe board, and reducing individual spring pin forces. None of these methods has been found to completely eliminate the deflection, but at best they merely control the deflection to an acceptable amplitude. From the foregoing it will be appreciated that there's room for improvement with regard to connections in the field of silicon chip testing, and more broadly in the general field of electrical connection.

SUMMARY OF THE INVENTION

According to an aspect of the invention, a male electrical connector includes: a platform; and contacts on at least one major surface of the platform. Thickness of the platform may be selectively changed.

According to another aspect of the invention, a female connector includes a connector body; and compression contacts attached to the connector body.

According to yet another aspect of the invention, a connector assembly includes: a male connector that in turn includes: a collapsible platform; and male contacts on major surfaces of the platform; and a female connector having female contacts for engaging the male contacts. The platform is configured to be collapsed for zero force insertion into the female connector, and is configured to be expanded to allow the male contacts to engage the female contacts.

According to still another aspect of the invention, a method of coupling together a male connector and a female connector, includes the steps of: compressing a platform of the male connector; inserting the platform between rows of female contacts of the female connector; and expanding the platform, thereby bringing male contacts on major surfaces of the platform into engagement with the female contacts.

According to another aspect of the invention, the male connector platform is connected to multiple transmission line cables and is the conduit through which the cables communicate with the probe board.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, which are not necessarily to scale.

DETAILED DESCRIPTION

A connector assembly includes a female dual row connector, and a male dual row connector configured to be inserted into the female dual row connector. The female connector is configured to be compression mounted onto a circuit board, and has conductive tails for being brought into contact with traces on the card or circuit board. The female connector may have a stiffener to resist bowing in the connector caused by the reaction force of the compressive contact tails on the board. The rows of contacts of the male connector may be selectively brought together (collapsed) or moved apart (expanded). The rows of contacts are collapsed during insertion or removal of the male connector from the female connector, thus allowing zero force insertion of the male connector into the female connector. The collapsing and expanding of the rows for the male connector may be accomplished through any of a variety of mechanisms.

Figure 1:
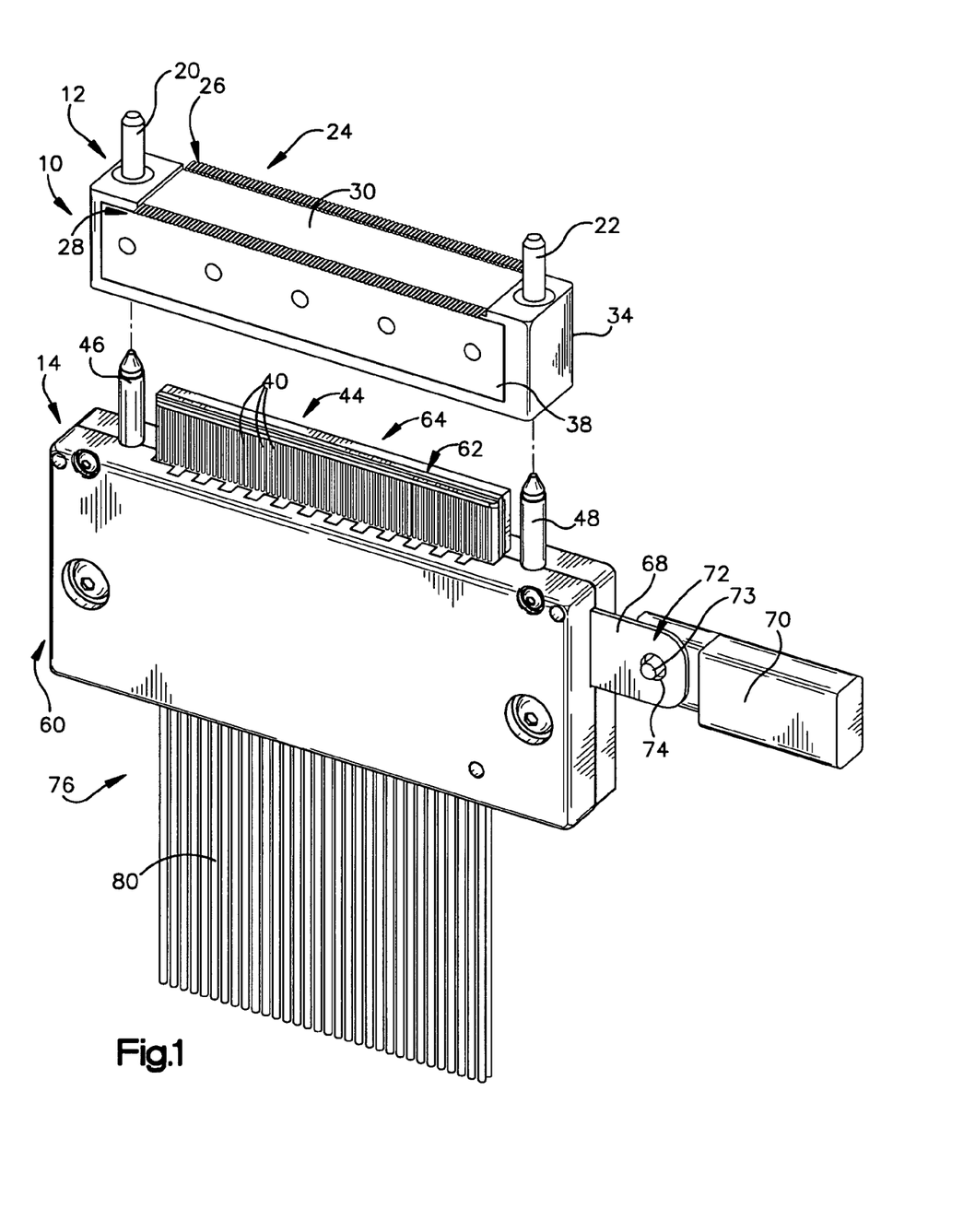
FIG. 1 is an oblique exploded view of a connector assembly in accordance with the present invention.

Referring to FIG. 1, a connector assembly 10 includes a female connector 12 that mates with a male connector 14. The female connector 12 is configured to be mounted on a circuit board. The female connector 12 includes attach screws 20 and 22 for mechanically coupling the female connector 12 to the circuit board. The female connector 12 has a plurality of conductive tails 24, arranged in rows 26 and 28 on either side of a bottom surface 30 of the female connector 12. The conductive tails 24 are used for electrically coupling contacts in the female connector 12 to suitable traces on the circuit board to which the female connector 12 is mounted. The conductive tails 24 are brought into cantilever compression contact with the traces on the circuit board, as the attach screws 20 and 22 are used to mount the female connector 12 to the circuit board.

The female connector 12 has within its connector body 34 two rows of female contacts. The female connector 12 also has metal stiffeners 38 on either side to provide additional stiffness for the female connector 12, as described in greater detail below. The female contacts of the female connector 12 mate with male contacts 40 of the male connector 14. The male contacts 40 are arrayed on opposite sides of a substantially-planar platform 44. The male connector 14 includes a pair of guide pins 46 and 48. The guide pins 46 and 48 are inserted into corresponding sockets or recesses in the attach screws 20 and 22 of the female connector 12. The guide pins 46 and 48 aid in properly positioning the male connector 14 relative to the female connector 12 as the male connector 14 is inserted into the female connector 12.

As described in greater detail below, the platform may be selectively contracted (made thinner) and expanded (made thicker), by use of a mechanism within the male connector body 60. Thus the rows 62 and 64 of the male contacts 40 may be selectively brought together during insertion of the male connector 14 into the female connector 12. This allows coupling of the connectors 12 and 14 with essentially zero insertion force (ZIF). Once the male contacts 40 are inserted into the female connector 12, the platform 44 may be expanded, moving the rows 62 and 64 of the male contacts 40 apart from one another, and into contact with the corresponding rows of contacts within the female connector 12.

The mechanism for accomplishing the expansion and contraction of the platform 44 includes movement as a ramp arm 68 and a through arm 70. The arms are coupled together at a link 72. The link 72 between the through arm 70 and the ramp arm 68 may have some clearance, allowing some degree of clearance or "float" between the pawl 73 of the through arm 70 and the mating hole 74 of the ramp arm 68. This clearance aids in proper mating of the connectors 12 and 14.

The male connector 14 may be part of a cable assembly 76. The cable assembly 76 includes one or more cables 80 that are inserted into the male connector body 60. Within the male connector body 60, the conductors of the cable(s) 80 are coupled to the rows 62 and 64 of the male contacts 40. The cable 80 may be one or more cables of any of a variety of cable types, such as coaxial signal wire, twin axial signal wire, twisted pair, or single conductor wire.

Figure 2A:
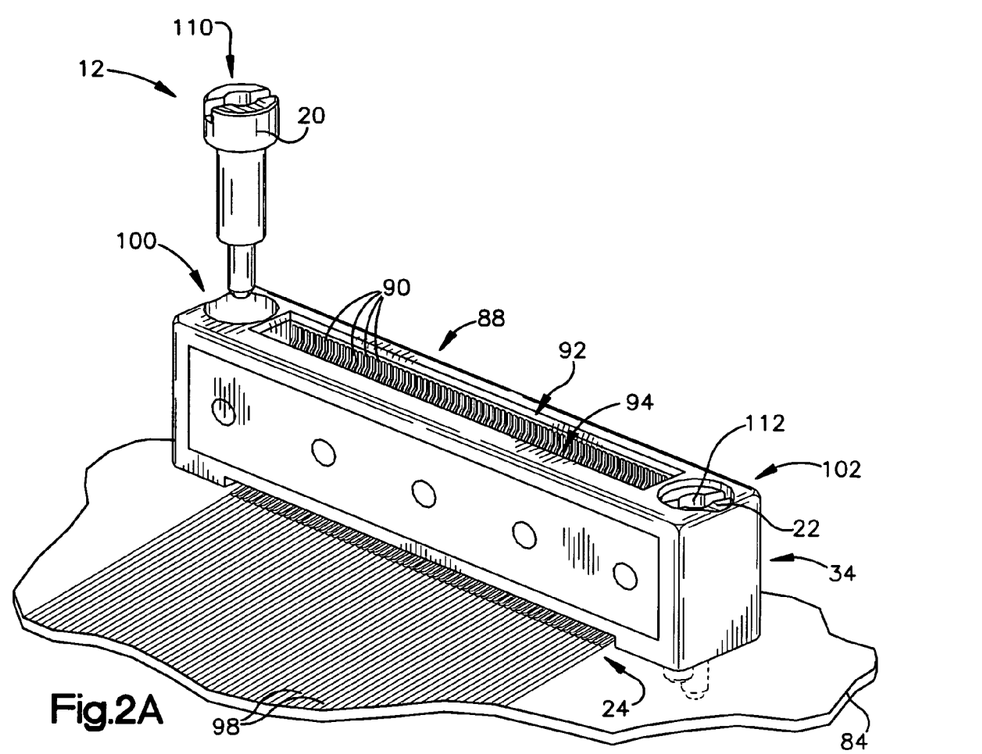
FIG. 2A is an oblique view of a female connector of the connector assembly of FIG. 1.
Figure 2B:
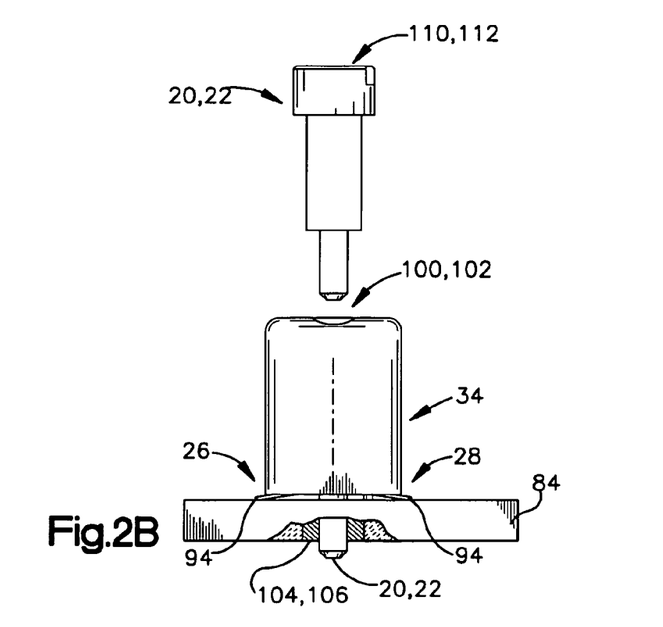
FIG. 2B is a side, partial cutaway view of the female connector of FIG. 2A.

Turning now to FIGS. 2A and 2B, further details are given of the female connector 12 and its coupling to a circuit board 84. The female connector body 34 has a central recess 88 for receiving the platform 44 of the male connector 14 (FIG. 1). Female contacts 90 are in rows 92 and 94 on opposite sides of the central recess 88. The female contacts 90 are configured to mate with the male contacts 40 of the male connector 14 (FIG. 1). The female contacts 90 include the conductive tails 24 at the bottom surface 30 of the female connector 12.

The conductor tails 24 are in contact with conductive traces 98 of the board 84. Mechanically coupling the female connector 12 to the board 84 presses the conductive tails 24 down against the conductive traces 98, causing some deflection in the conductive tails 24 that results in a compressive force of the conductive tails 24 against the conductive traces 98.

The female connector body 34 also includes end recesses 100 and 102 for receiving the attach screws 20 and 22. The attach screws 20 and 22 are inserted into the end recesses 100 and 102, and engage blind threaded inserts 104 and 106 that are in the circuit board 84. As the attach screws 20 and 22 engage the threaded inserts 104 and 106 and are tightened, the female connector 12 is pulled against the circuit board 84. This causes a compression force on the contact tails 24, resulting in engagement between the contact tails 24 and the conductive traces 98 on the circuit board 84. The forces of compression on the contact tails 24 are equal to and opposite the attaching force holding the attach screws 20 and 22 to the inserts 104 and 106. Thus the net force on the circuit board is essentially zero.

The female connector body 34 may be largely made of a suitable plastic. However, the body may have a pair of stiffeners 38, one on either side of the female connector body 34. The stiffeners 38 may aid in preventing bowing of the female connector 12 due to the contact forces from the engagement of the attach screws 20 and 22, and the contact tails 24, with the circuit board 84. The stiffeners may be made of a suitable sheet metal, for example, a suitable stainless steel.

As noted above, the attach screws 20 and 22 have guide holes or sockets 110 and 112 for receiving the positioning or guide pins 46 and 48 of the male connector 14 (FIG. 1). It will be appreciated that other suitable alignment mechanisms or alignment mechanism locations may alternatively be utilized to facilitate proper alignment of the connectors 12 and 14.

Figure 3A:
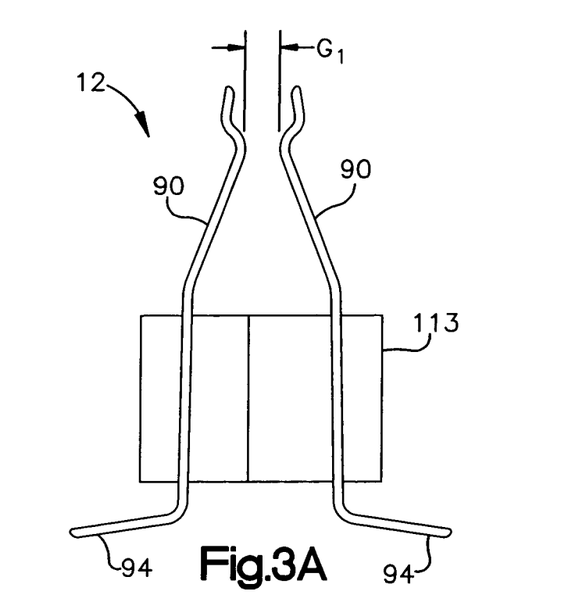
FIG. 3A is a side view showing female contacts of the female connector, in their unloaded configuration.
Figure 3B:
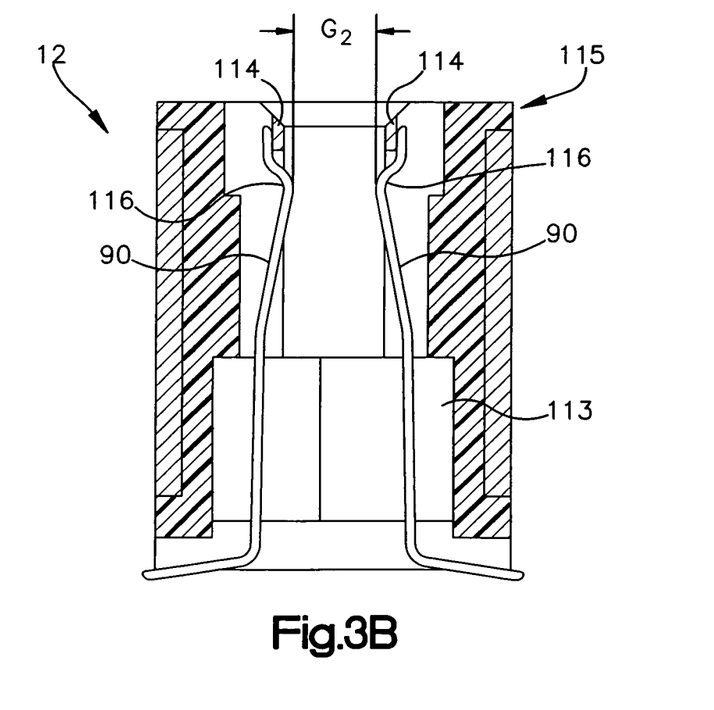
FIG. 3B is a side view showing female contacts of the female connector, in their preloaded configuration.

With reference now in addition to FIGS. 3A and 3B, details are discussed of the configuration of the female contacts 90 within the female connector 12. FIG. 3A shows the female contacts 90 molded into a header body 113. The female contacts 90, in the unloaded condition shown in FIG. 3A, have a small gap $G_1$ between them.

FIG. 3B shows the female contacts 90 in their preloaded condition, resting on ledges 114 of a cap 115, with a larger gap $G_2$ between bends 116 of the contacts 90. The ledges 114 are insert molded into the cap 115. The ledges 114 are located just outside of the gap $G_2$, such that when the platform 44 of the male connector 14 (FIG. 1) is inserted into the female connector 14 only a small amount of deflection is required to separate the female contacts 90 to allow insertion. Insertion causes the female contacts 90 to deflect slightly outward, away from a centerline of the female connector 14. This causes the female contacts 90 to be moved away from and out of contact with the ledges 114, transferring the preload forces of the female contacts 90 from the ledges 114 to the male contacts 40 (FIG. 1) of the male connector 14.

Most of the deflection of the female contacts 90 required for insertion is done by preloading the female contacts 90 by bending them back, having them press inward against the ledges 114. This preloading of the female contacts 90 may be substantially at the desired contact force for the female contacts 90 to press against the male contacts 40 (FIG. 1) when the connectors 12 and 14 are mated together. The preloading of the female contacts 90 allows the desired contact force to be achieved with only a minimal further deflection of the female contacts 90 required during mating of the connectors 12 and 14.

Figure 4:
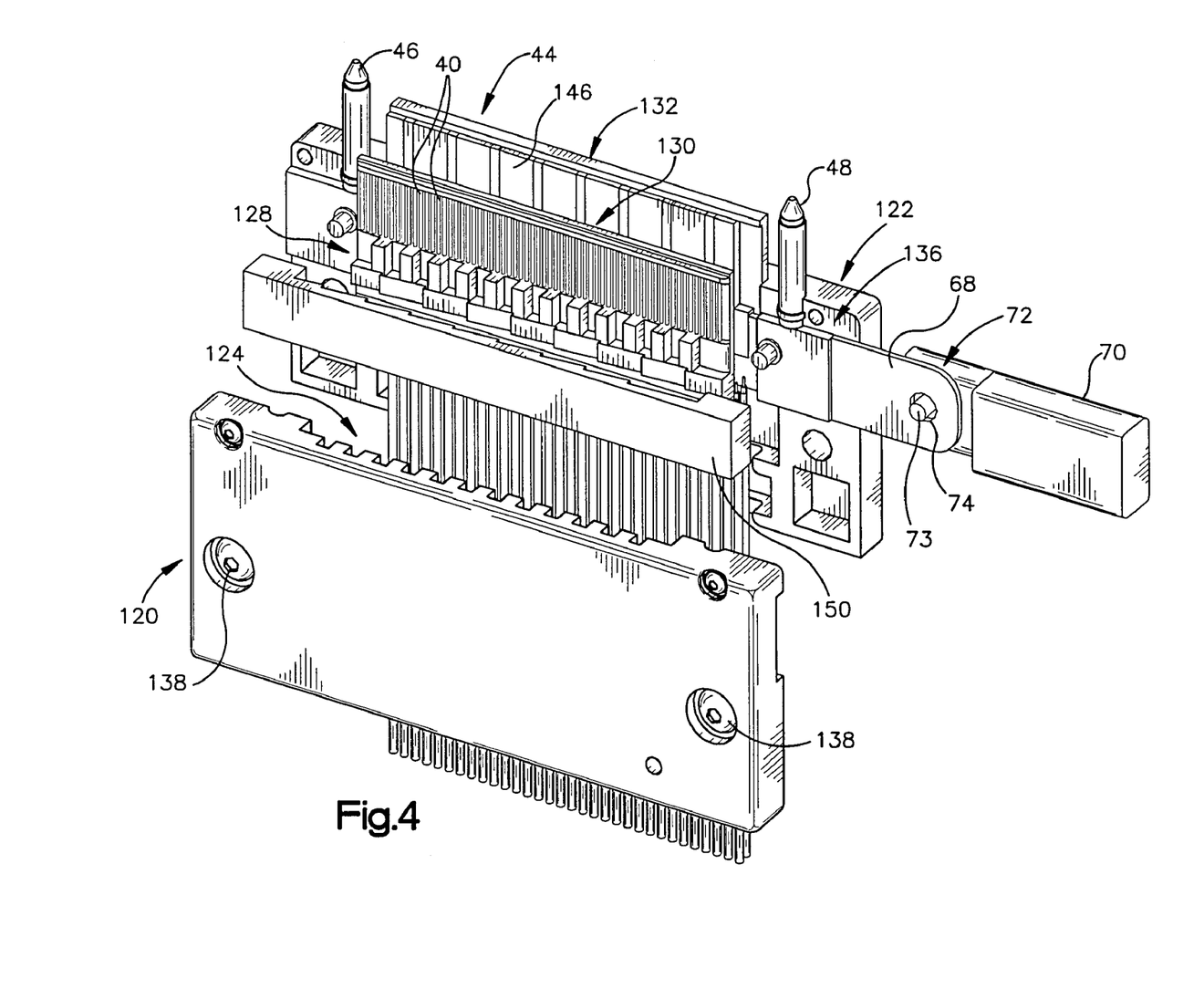
FIG. 4 is an exploded oblique view of a male connector of the connector assembly of FIG. 1.

Turning now to FIG. 4, details of the male connector 14 are discussed. The male connector body 60 includes a pair of plastic shells 120 and 122 that enclose the working parts of the male connector 14. The shell 120 includes a shell keyed section 124 of alternating protrusions and recesses. The shell keyed section 124 mates with a corresponding header keyed section 128 of a male contact header 130. Similar mating of keyed sections is provided between the shell 122 and a male contact header 132. The mating keyed sections 124 and 128 maintain the position of the male contact headers 130 and 132, relative to the shells 120 and 122.

Besides the male contact headers 130 and 132, which together make up the platform 44, the shells 120 and 122 enclose parts of a shuttle (slider) 136 that is moved back and forth so as to selectively control the thickness of the platform 44. The shuttle 136 is used to move selectively the male contact headers 130 and 132 closer to one another, or further away from one another. As discussed above, the male contact headers 130 and 132 are moved toward one another for insertion of the male connector 14 into the female connector 12. The male contact headers 130 and 132 are then moved apart to allow the male contacts 40 to engage the corresponding female contacts 90 (FIG. 2A), thereby electrically coupling the female connector 12 and the male connector 14. For disengagement of the male connector 14 from the female connector 12, the male contact headers 130 and 132 are brought together once again, decreasing the thickness of the platform 44, and disengaging the male contacts 40 from the female contacts 90.

The positioning or guide pins 46 and 48 are attached to one or the other of the shells 120 and 122. The guide pins 46 and 48 may be suitably placed within a mold as the shells 120 and/or 122 are molded around them. The guide pins 46 and 48 may each contain a boss or undercut which allows them to be retained in the shells as the shells 120 and 122 are fastened together. The shells 120 and 122 may be held together by suitable fasteners 138.

Figure 5:
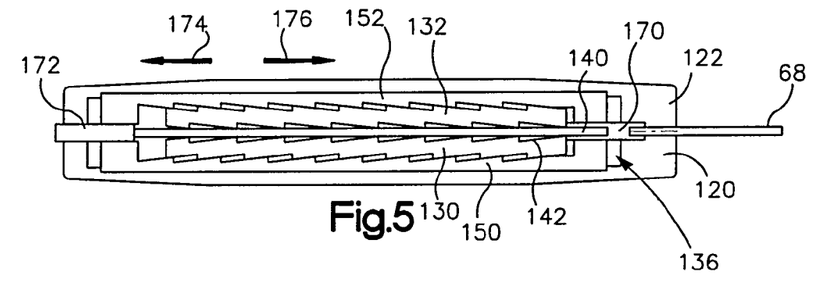
FIG. 5 is an end view of the male connector of FIG. 4.
Figure 6:
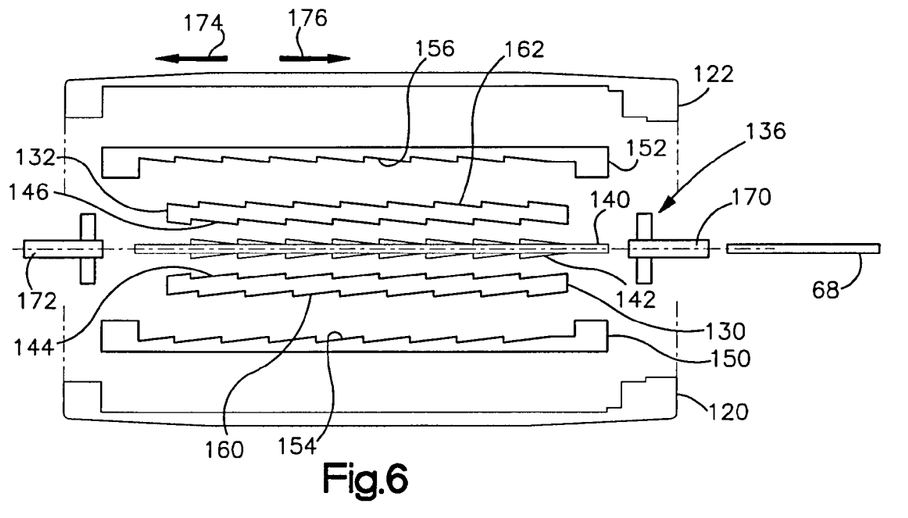
FIG. 6 is an exploded end view of the male connector of FIG. 4.

With reference in addition to FIGS. 5 and 6, details and operation of the shuttle 136 are now described. The shuttle 136 includes a central spine 140 that runs between the male contact headers 130 and 132. The spine 140 has spine ramps 142 on its major surfaces on both sides. The spine ramps 142 are used for engaging inner (inboard) ramped surfaces 144 and 146 of the male contact headers 130 and 132, respectively. The spine ramps 142 are used to press outward against the inner ramped surfaces 144 and 146 of the male contact headers 130 and 132, when the shuttle 136 is appropriately moved. The spine 140 may be made of a suitable sheet metal, with the spine ramps 142 being plastic protrusions formed on the major surfaces of the spine 140.

The shuttle 136 also includes ramped members 150 and 152, also referred to herein as covers. The ramped members 150 and 152 have respective ramped inner surfaces 154 and 156 for engaging header outer (outboard) ramped surfaces 160 and 162 of the male contact headers 130 and 132. The inner ramped surfaces or return ramps 154 and 156 of the ramped members 150 and 152, and the outer ramped surfaces 160 and 162 of the male contact headers 130 and 132, are configured such that the ramped surfaces may cooperate with one another to press the male contact headers 130 and 132 toward one another, when the shuttle 136 is moved in the appropriate direction.

The spine 140 and the ramped members 150 and 152 are connected together by bearing blocks 170 and 172 on either side of the male connector body 60. The bearing block 170 is also attached to the ramp arm 68. The bearing blocks 170 and 172 are able to slide back and forth relative to the shells 120 and 122. The shells 120 and 122 have suitable recesses for allowing movement of the shuttle 136 back and forth.

As described above, the ramp arm 68 is coupled to a through arm 70 via a link 72. The through arm 70 is in turn coupled to an appropriate mechanism for moving it back and forth, thereby actuating movement of the shuttle 136 back and forth.

In its normal activated configuration (with no external force applied), the platform 44 is expanded, with the spine ramp 142 engaging the inner ramped surfaces 144 and 146 of the male contact headers 130 and 132, to maintain the male contact headers 130 and 132 apart from one another. When contraction of the platform 44 is desired, for example, in order to insert the platform 44 into the female connector 12, or to extract the platform 44 from the female connector 12, the shuttle 136 is moved in the direction 174, leftward as shown in FIGS. 4-6.

The engagement and disengagement of the contact headers 130 and 132 is accomplished by a series of ramps as indicated previously. The spine 140 contains plastic ramps 142 that are molded onto the spine 140, so that there is no relative movement—the ramps 142 are locked to the spine 140. The covers 150 and 152 contain return ramps 154 and 156, which cause the contact headers 130 and 132 to disengage, or move closer to one another. The covers 150 and 152 are fixed to the spine 140 so that these parts move together. All of the ramped surfaces on each respective side of the connector 14 are parallel. The angles of the ramped surfaces about the centerline of the connector 14 (the axis of the spine 140) are mirror images of one another. This allows the same motion of the contact headers 130 and 132 on both sides of the connector 14. That is, if the motion of the spine 140 causes contact header 130 to move outward, contact header 132 will also move outward.

The contact headers 130 and 132 are constrained in the axis of the motion of the spine 140 so that as the ramps 142 are actuated or de-actuated, the only motion available for the contact headers is inward or outward, perpendicular to the surface of the spine 140. As the spine 140 is moved in one direction, the contact headers 130 and 132 move outward, away from the spine 140. As the spine 140 is moved in the opposite direction, the contact headers 130 and 132 move inward, toward the spine 140. This inward motion compresses the platform 44, reducing the overall thickness of the platform 44. This allows insertion or removal of the platform 44 from the female contact header 12 with essentially zero insertion or removal force.

Once the platform 44 is inserted into the female connector 12, the shuttle 136 may be moved in the direction 176, rightward as shown in FIGS. 4-6, to expand the platform 44. The ramped inner surfaces 154 and 156 engage the header outer ramped surfaces 160 and 162, and press the headers 130 and 132 toward one another.

Figure 7:
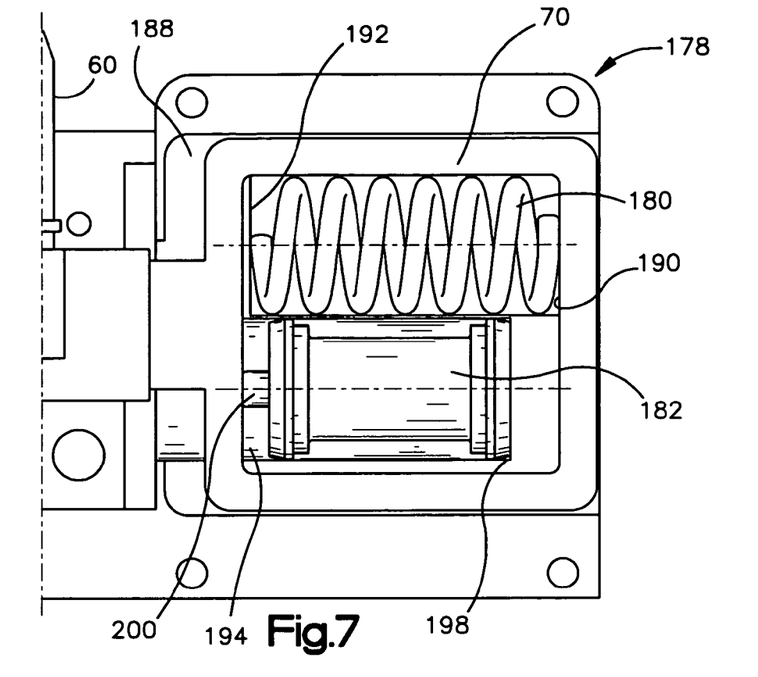
FIG. 7 is a cutaway plan view of an actuator of the male connector of FIG. 1, showing the actuator retracted.
Figure 8:
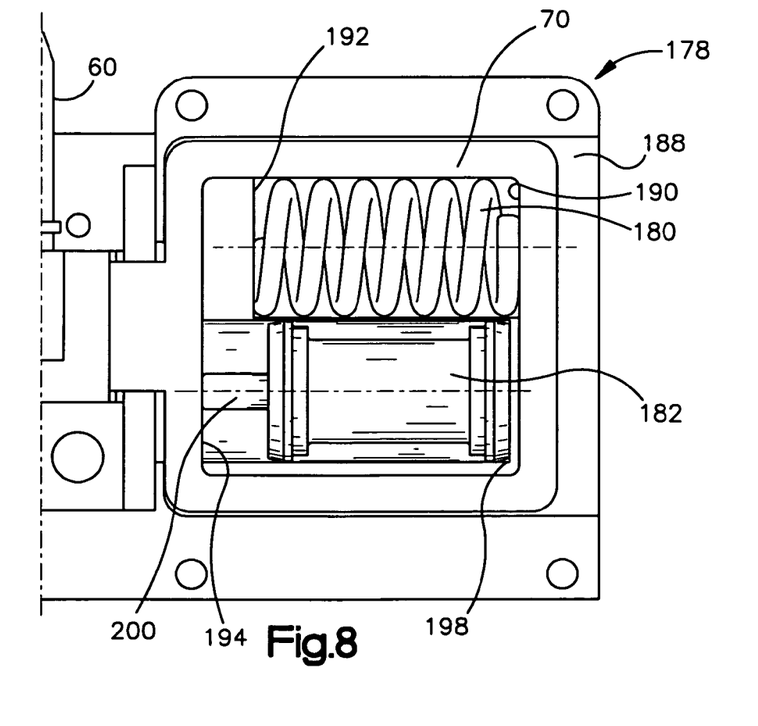
FIG. 8 is another cutaway plan view of the actuator of the male connector, showing the actuator extended.

FIGS. 7 and 8 illustrate one mechanism for moving the through arm 70, and thus moving the shuttle 136. The mechanism involves an actuator module 178 that includes a spring in parallel with a cylinder 182. The spring 180 and the cylinder 182 are mounted within an actuator body 188 so as to be able to engage the through arm 70, to move selectively the through arm 70 in opposite directions. The through arm 70 and the cylinder 182 are mounted within cavities in the through arm 70 and the actuator body 188. The spring 180 is mounted in contact with a distal surface 190 of the through arm 70 (away from the male connector body 60), and a proximal surface 192 of the actuator body 188 (relatively close to the male connector body 60). Thus spring forces from the compressed spring 180 tend to push the through arm 70 away from the male connector body 60.

The cylinder 182 is in contact with a proximal surface 194 of the through arm 70, and a distal surface 198 of the actuator body 188. Thus expansion of the cylinder 182 tends to urge the through arm 70 closer to the male connector body 60.

FIG. 7 shows the position of the components of the system when the cylinder 182 is not providing any force. The spring 180 expands in its recess to push the through arm 70 to the end of its travel. This corresponds to a situation where the platform 44 (FIG. 1) is expanded, with the male contacts 40 (FIG. 1) in a position to engage the female contacts 90 of the female connector 12 (FIG. 2A). The cylinder 182 is in a retracted position.

When the cylinder 182 is extended, the system takes on the configuration shown in FIG. 8. Extension of the cylinder 182 overcomes the force of the spring 180, causing compression of the spring 180 and movement of the through arm 70 leftward in the figure. This moves the shuttle 136 (FIG. 4) so as to cause compression of the platform.

The cylinder 182 may have any of a variety of means or mechanisms for retracting and/or extending. According to one configuration, the cylinder 182 includes a polymer material element 200. When the polymer material element 200 is heated, such as by applying suitable electrical current to the element 200, it expands, causing the cylinder 182 to extend. Removal of the current results in cooling of the polymer wire or element 200, causing retraction of the cylinder 182 under the return force of the spring 180. One example of a suitable material for the polymer material element 200 is polyethylene. It will be appreciated that other sorts of cylinders, such as air cylinders, may be used instead of a polymer cylinder. More broadly, actuators using any of a wide variety of forces, such as pneumatic forces or pressurized fluids, may be used to overcome the force of the spring 180.

The clearance or float at the link 72 (FIG. 1), between the pawl 73 of the through arm 70 and the mating hole 74 of the ramp arm 68, allows for some lateral movement of the male connector 14. Because of the float in the link 72, the male connector 14 has some "float," which may allow the connectors 12 and 14 to self-align to some extent, for example to compensate for individual differences in components.

It will be appreciated that the system described above for moving the through arm 70 has the advantage of minimal complexity and a small number of moving parts. It is also reliable for repeated operation. Further, it will be appreciated that the mechanism of actuation requires no external force or external energy to maintain the platform 44 in its expanded state, wherein the male and female contacts engage one another. Further details regarding device test interfaces with such a mechanism may be found in U.S. Pat. No. 6,316,954, which is hereby incorporated by reference in its entirety.

It will be appreciated that a large number of different sorts of actuation mechanisms may alternatively be employed. For example, it will be appreciated that electrical forces, such as a solenoid may be utilized to selectively move the through arm 70.

As another alternative, the cylinder 182 may include a suitable shape memory alloy that expands when heated, allowing extension of the cylinder 182 by suitable heating of the shape memory alloy. An example of a suitable shape memory alloy is a nickel-titanium alloy. Heating of the shape memory alloy may be accomplished by resistive heating, through connecting the shape memory alloy to a suitable power supply.

It will be appreciated that the connection method described above provides several advantages relative to other methods of electrical connection for use in silicon chip testing. First, insertion forces are minimized by use of the collapsible platform 44 allowing for zero or very low insertion forces. Second, the female connector described above couples to a board with substantially no net force. In addition, the sheet metal stiffeners in the female connector help prevent deflection of the connector. Further, no external forces or power supplies are required to maintain the male contacts coupled to the female contacts. Rather there is a quiescent coupling due to the action of the spring.

Figure 9:
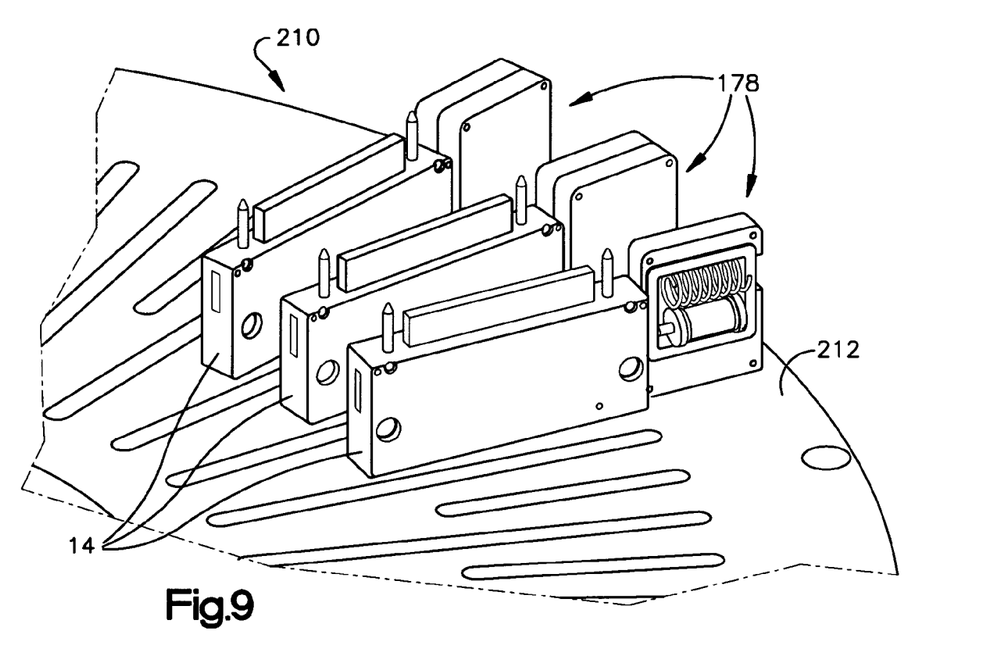
FIG. 9 is an oblique, partially cutaway view of a test device that includes a connector assembly of the present invention.

FIG. 9 illustrates one possible application for the connectors described above. As shown, a device tester 210 includes male connectors 12 and actuator modules 178 that are mounted in suitable slots as part of a test head 212 for testing integrated circuits or other devices. The male connectors 12 may be part of cable assemblies 76 that may include connectors at both ends. It will be appreciated that due to the large number of connectors that may be involved in a device tester, reducing the insertion force for such connectors would be desirable. Accordingly, it will be appreciated that the zero insertion force connectors described above may be advantageously utilized in such a device tester. Further details regarding device test interfaces may be found in U.S. Pat. No. 6,316,954, which is hereby incorporated by reference in its entirety.

However, it will be appreciated that ZIF connectors such as that described above may be utilized in a wide variety of electrical and electronic interfaces. Suitable modifications may be made with regard to the number, type, and configuration of contacts utilized. Furthermore, it will be appreciated that other types of relative movement of contacts may be utilized to reduce the profile of connectors for zero- or low-force insertion.

Figure 10:
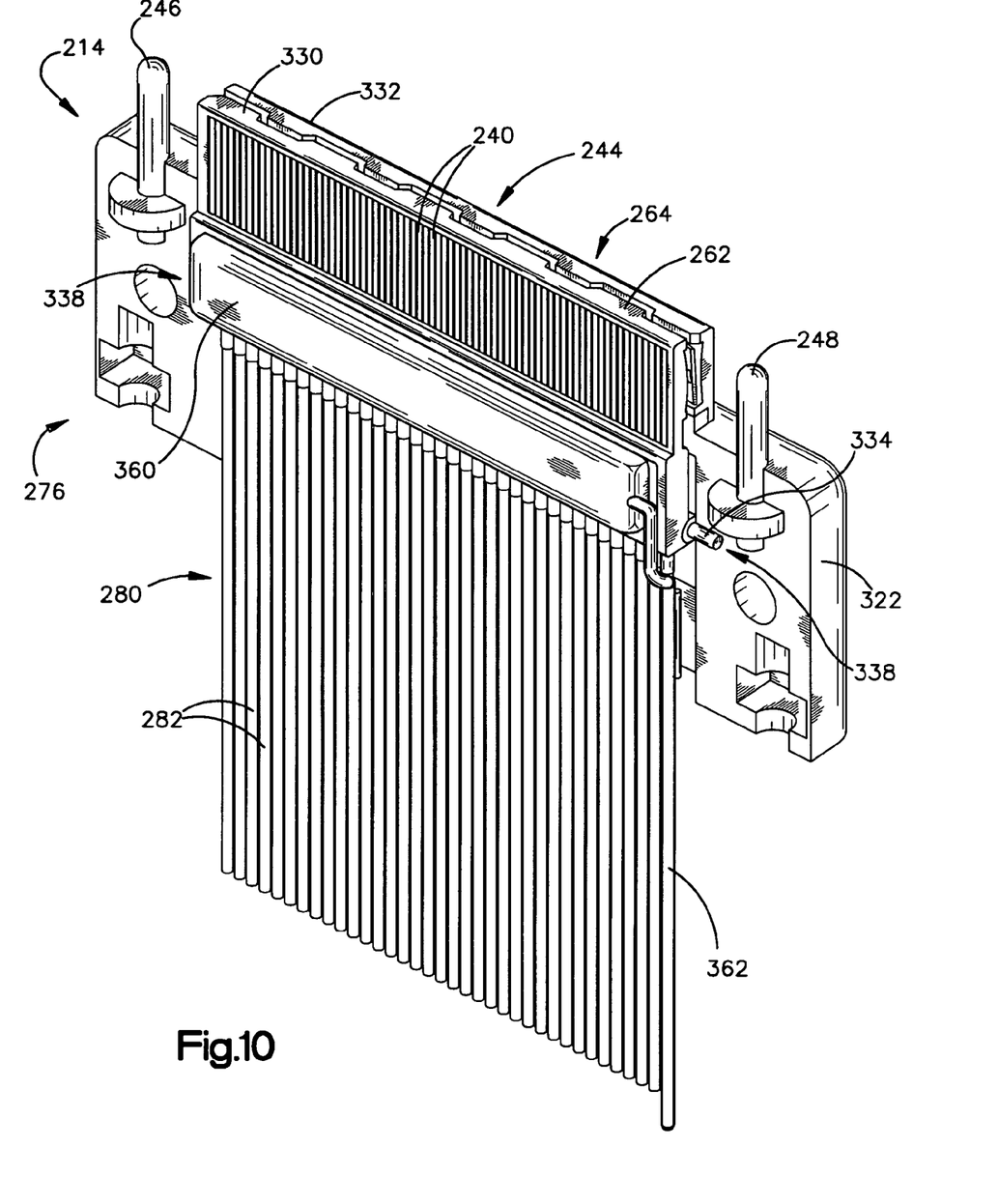
FIG. 10 is an oblique view of another embodiment male connector in accordance with the present invention, with some parts removed for purposes of illustration.

FIG. 10 illustrates a male connector 214 that includes a different mechanism, a wavy spring and compressed air, for controlling thickness of its platform 244. The platform 244 includes male contacts 240 in an array that may be similar to that of the male contacts 40 of the platform 44 (FIG. 1), with rows 262 and 264 of the contacts 240. Guide pins 246 and 248 are also similar to corresponding features of the male connector 14 of FIG. 1. A cable 280 includes conductors 282 that are coupled to the male contacts 240, with the male connector 214 and the cable 280 together constituting a cable assembly 276.

Figure 11:
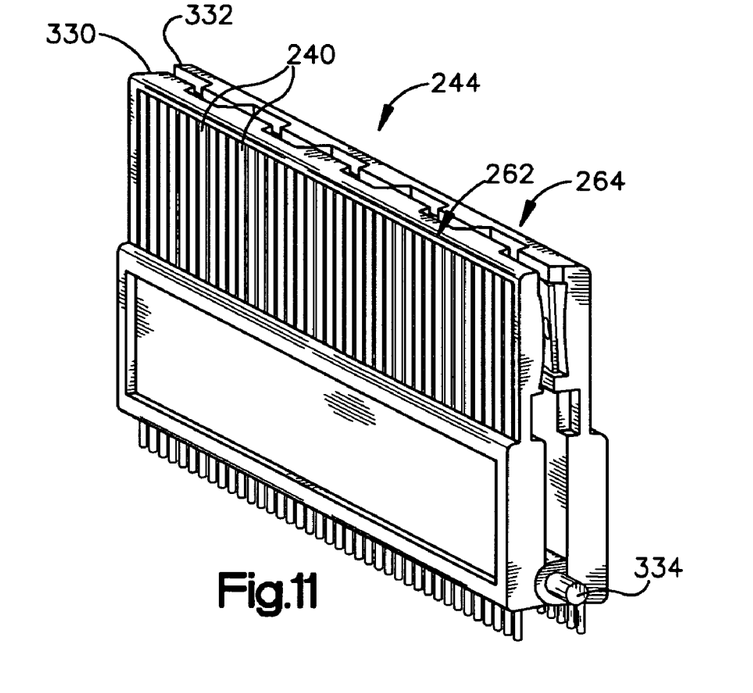
FIG. 11 is an oblique view of the platform of the connector of FIG. 10.
Figure 12:
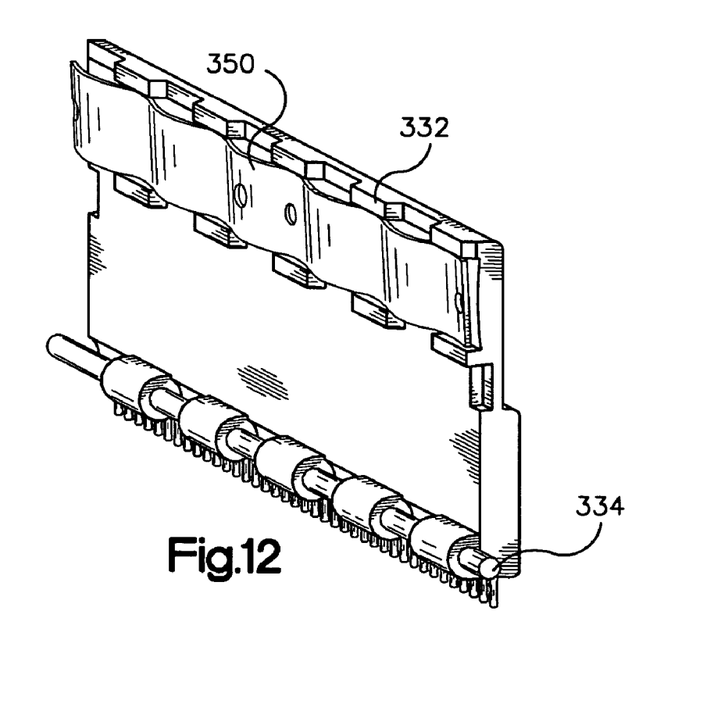
FIG. 12 is an oblique view of the platform of FIG. 11, with one of the headers removed.

With reference now in addition to FIGS. 11 and 12, the platform 244 includes a pair of male contact headers 330 and 332 that are hingedly coupled together at one end by a pivot pin 334. The pivot pin 334 fits into recesses 338 in a plastic shell 322 of a male connector body 260. Another similar plastic shell is omitted from FIG. 10 for purposed of illustration. By rotating the headers 330 and 332 relative to one another about the pivot pin 334, the thickness of the platform 244 may be altered, bringing together or moving apart the rows 262 and 264 of the contacts 240.

A resilient device, such as a wavy linear spring 350, is used to maintain the contact headers 330 and 332 apart from one another when no external force is applied. The spring 350, which may be made of a suitable metal such as steel, may be configured to provide a suitable engagement force to cause the male contacts 240 to engage female contacts 90 of a corresponding female connector 12 (FIG. 2A). Although a wavy linear spring is shown, it will be appreciated that a wide variety of types of springs or other types of resilient devices may be used to provide outward force on the contact headers 330 and 332.

In order to reduce the thickness of (compress) the platform 244, pressurized gas is introduced into one or more bladders, such as the bladder 360, having flexible surfaces in contact with outer surfaces of the male contact headers 330 and 332. The pressurized gas, which may be compressed air supplied by a shop air supply, produces an inward force on the male contact headers 330 and 332. The force of the pressurized gas on the outer surfaces of the male contact headers 330 and 332 presses them inward against the force of the spring 350 toward one another, thereby reducing the thickness of the platform 244 as the headers 330 and 332 rotate about the pivot pin 334. With the thickness of the platform 244 reduced, the platform 244 may be inserted or removed from a recess of a corresponding female mating connector with substantially zero insertion or removal force. Once the platform 244 is inserted or removed from the female connector, the pressure in the bladder(s) may be released, causing the spring actuator 350 to move the headers 330 and 332 apart about the pivot pin 334, thickening the platform 244.

The male connector 214 may have two bladders, one on each of the headers 330 and 332. The bladders may be in communication with one another. Alternatively, there may be but a single bladder, extending around the outer surfaces of both of the headers 330 and 332. The plastic shells, such as the plastic shell 322, have inner surfaces that press inward against outer surfaces of the bladder(s) 360. A metal stiffener plate may be included in the male connector 214, such as in the plastic shell 322, to stiffen and support the plastic case of the connector to resist the force of the pressurized gas in the bladder(s) 360.

The cable 280 may include a gas supply tube 362 that is laminated alongside the conductors 282 of the cable 280. The gas supply tube 362 is connected to the bladder(s) 360, to provide pressurized gas to the bladder(s) 360, and to allow venting of pressurized gas from the bladder(s) 360. The gas supply tube 362 may be coupled to a gas supply, such as a shop air supply of pressurized air.

It will be appreciated that the male connector 214 has the advantageous properties of a substantially zero insertion and removal force, and of requiring no external force to maintain the male contacts 240 engaged with corresponding contacts of a female connector. In addition, it will be appreciated that a substantially equal compressing force may be provided on the headers 330 and 332, thus facilitating the platform 244 being self centering within the male connector 214, especially when compressed gas is employed to reduce the thickness of the platform 244. Further, including the gas supply tube 362 as part of the cable 280 makes the cable assembly 276 compact, without a need to route a separate gas supply tube to the male connector 214.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A male electrical connector comprising:
   a substantially-planar platform; and
   contacts on at least one major surface of the platform;
   wherein thickness of the platform is selectively changeable;
   wherein the contacts on the platform are electrically coupled to conductors of one or more cables.

2. The connector of claim 1 wherein the thickness of the platform is at a maximum when no external force is applied, and wherein an external force may be applied to reduce the thickness of the platform.

3. The connector of claim 1 wherein the contacts are on major surfaces on opposite sides of the platform.

4. The connector of claim 3,
   wherein the platform has a pair of headers; and
   wherein the contacts are on the headers;
   further comprising a resilient device between the headers, wherein the resilient device maintains the headers apart.

5. The connector of claim 1 wherein the connector is a zero force insertion connector.

6. The connector of claim 1,
   further comprising a male connector body surrounding the platform;
   wherein the one or more cables are inserted into the male connector body.

7. A male electrical connector comprising:
   a platform having a pair of headers;
   contacts on at least one major surface of the platform, on at least one of the headers; and
   a slider which is operatively coupled to the pair of headers of the platform, to selectively separate and bring together the headers;
   wherein thickness of the platform is selectively changeable.

8. The connector of claim 7, wherein the headers have header ramped surfaces that are engaged by slider ramped surfaces of the slider.

9. The connector of claim 8,
   wherein the header ramped surfaces are outboard surfaces of the headers; and
   wherein the slider includes;
   a central spine, between the headers;
   spine ramps on the central spine, wherein the spine ramps engage inboard surfaces of the headers; and
   ramped members that include the ramped surfaces that engage respective of the outboard surfaces of the headers.

10. The connector of claim 7, further comprising a shell surrounding the headers.

11. The connector of claim 10, wherein the shell includes keyed surfaces that engage mating surfaces on the headers.

12. The connector of claim 7,
    further comprising an actuator operatively coupled to the slider via a link between the slider and a through arm that is mechanically coupled to the actuator;

wherein the actuator operates to change the thickness of the platform.

13. The connector of claim 12, wherein the link provides an amount of float, to thereby allow a portion of the connector on one side of the link to move relative to the actuator.

14. The connector of claim 12, wherein the actuator includes a spring.

15. A male electrical connector comprising:
a substantially-planar platform having a pair of headers;
contacts on major surfaces on opposite sides of the platform, on the headers;
a resilient device between the headers, wherein the resilient device maintains the headers apart; and
at least one bladder that presses inward against outer surfaces of the headers when the at least one bladder contains a pressurized gas;
wherein thickness of the platform is selectively changeable.

16. The connector of claim 15, as part of a cable assembly that includes a cable attached to the male connector, wherein the cable includes a gas supply tube in communication with the at least one bladder.

17. A male electrical connector comprising:
a substantially-planar platform having a pair of headers;
contacts on major surfaces on opposite sides of the platform, on the headers; and
a resilient device between headers, wherein the resilient device maintains the headers apart;
wherein thickness of the platform is selectively changeable; and
wherein the headers are hingedly coupled together by a pivotal means.

18. The connector of claim 17, in combination with a female connector that the male connector mates with.

19. The combination of claim 18, wherein the female connector has preloaded female contacts that rest on ledges of the female connector prior to insertion of the platform into the female connector.

20. The connector of claim 17, as part of a cable assembly that includes a cable attached to the male connector.

21. A male electrical connector comprising:
a substantially-planar platform having a pair of contact headers, wherein thickness of the platform is selectively changeable;
contacts on at least one major surface of the platform, on at least one of the headers;
a wavy linear spring between the pair of contact headers of the platform, wherein the resilient device maintains the headers apart; and
at least one bladder that presses inward against outer surfaces of the headers when the at least one bladder contains a pressurized gas;
wherein the headers are hingedly coupled together by a pivot pin; and
wherein the thickness of the platform is at a maximum when no external force is applied, and wherein an external force may be applied to reduce the thickness of the platform.

22. The connector of claim 21, as part of a cable assembly that includes a cable attached to the male connector, wherein the cable includes a gas supply tube in communication with the at least one bladder.

* * * * *